(12) United States Patent
Morimitsu et al.

(10) Patent No.: US 11,384,424 B2
(45) Date of Patent: Jul. 12, 2022

(54) FILM MANUFACTURING APPARATUS AND MANUFACTURING METHOD OF DOUBLE-SIDED LAMINATED FILM

(71) Applicant: NITTO DENKO CORPORATION, Ibaraki (JP)

(72) Inventors: Daiki Morimitsu, Osaka (JP); Shunsuke Shuto, Osaka (JP); Kenichiro Nishiwaki, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/041,089

(22) PCT Filed: Dec. 17, 2018

(86) PCT No.: PCT/JP2018/046376
§ 371 (c)(1),
(2) Date: Sep. 24, 2020

(87) PCT Pub. No.: WO2019/187394
PCT Pub. Date: Oct. 3, 2019

(65) Prior Publication Data
US 2021/0108308 A1   Apr. 15, 2021

(30) Foreign Application Priority Data
Mar. 27, 2018   (JP) .............................. JP2018-059992

(51) Int. Cl.
*C23C 14/56* (2006.01)
*C23C 14/52* (2006.01)
(Continued)

(52) U.S. Cl.
CPC .............. *C23C 14/52* (2013.01); *C23C 14/34* (2013.01); *C23C 14/54* (2013.01); *C23C 14/562* (2013.01);
(Continued)

(58) Field of Classification Search
None
See application file for complete search history.

(56) References Cited

U.S. PATENT DOCUMENTS

| 2013/0029163 | A1  | 1/2013 | Nashiki et al. |
| 2014/0166989 | A1* | 6/2014 | Ma ..................... H01L 51/0021 257/40 |
| 2018/0066361 | A1* | 3/2018 | Nara .................... C23C 16/448 |

FOREIGN PATENT DOCUMENTS

| JP | 3-245514 A    | 11/1991 |
| JP | 2000-161923 A | 6/2000  |

(Continued)

OTHER PUBLICATIONS

Decision to Grant a Patent dated Oct. 5, 2021, issued in counterpart JP Application No. 2018-059992 (3 pages).
(Continued)

*Primary Examiner* — Jason Berman
(74) *Attorney, Agent, or Firm* — WHDA, LLP

(57) ABSTRACT

A film manufacturing apparatus includes a lamination unit that laminates a first layer at one side in a thickness direction of a long-length substrate film to produce a one-sided laminated film, and that laminates a second layer at the other side in the thickness direction of the one-sided laminated film to produce a double-sided laminated film; a conveyance unit; a marking unit; a measurement unit; a detection unit, disposed at an upstream side in the conveyance direction of the measurement unit; and an arithmetic unit that obtains physical properties of the first layer and the second layer based on the physical property at a first position in the one-sided laminated film and the physical property at a second position in the double-sided laminated film. The arithmetic unit defines, with a mark as a reference, a position substantially the same as the first position to be the second position.

6 Claims, 5 Drawing Sheets

(51) Int. Cl.
    *C23C 14/34*      (2006.01)
    *C23C 14/54*      (2006.01)
    *G01R 27/02*      (2006.01)
    *H01B 5/14*      (2006.01)
    *H01J 37/32*      (2006.01)
    *H01J 37/34*      (2006.01)

(52) U.S. Cl.
    CPC ............... *G01R 27/02* (2013.01); *H01B 5/14* (2013.01); *H01J 37/3277* (2013.01); *H01J 37/3476* (2013.01)

(56) References Cited

FOREIGN PATENT DOCUMENTS

| JP | 2001-3167 A | 1/2001 |
| JP | 2006-131955 A | 5/2006 |
| JP | 2008-69378 A | 3/2008 |
| JP | 2012-77330 A | 4/2012 |
| JP | 2013-49916 A | 3/2013 |
| JP | 2017-137527 A | 8/2017 |
| JP | 2019-31039 A | 3/2018 |
| JP | WO2016/204204 A1 | 3/2018 |
| KR | 10-2009-0120034 A | 11/2009 |
| KR | 10-2016-0098594 A | 8/2016 |
| TW | 201022463 A | 6/2010 |
| WO | 2017/158895 A1 | 9/2017 |

OTHER PUBLICATIONS

Notification Concerning Transmittal of International Preliminary Report on Patentability (Form PCT/IB/326) issued in counterpart International Application No. PCT/JP2018/046376 dated Oct. 8, 2020 with Forms PCT/IB/373, PCT/IB/338 and PCT/ISA/237. (13 pages).
International Search Report dated Feb. 5, 2019, issued in counterpart application No. PCT/JP2018/046376, w/English translation (5 pages).
Written Opinion dated Feb. 5, 2019, issued in counterpart application No. PCT/JP2018/046376 (4 pages).
Office Action dated Jan. 26, 2022, issued in counterpart to CN Application No. 201880091373.0, with English Translation. (15 pages).
Office Action dated Apr. 21, 2022, issued in counterpart KR application No. 10-2020-7027255, with English translation. (4 pages).
Office Action dated Apr. 7, 2022, issued in counterpart TW application No. 108100958, with English translation. (6 pages).

* cited by examiner

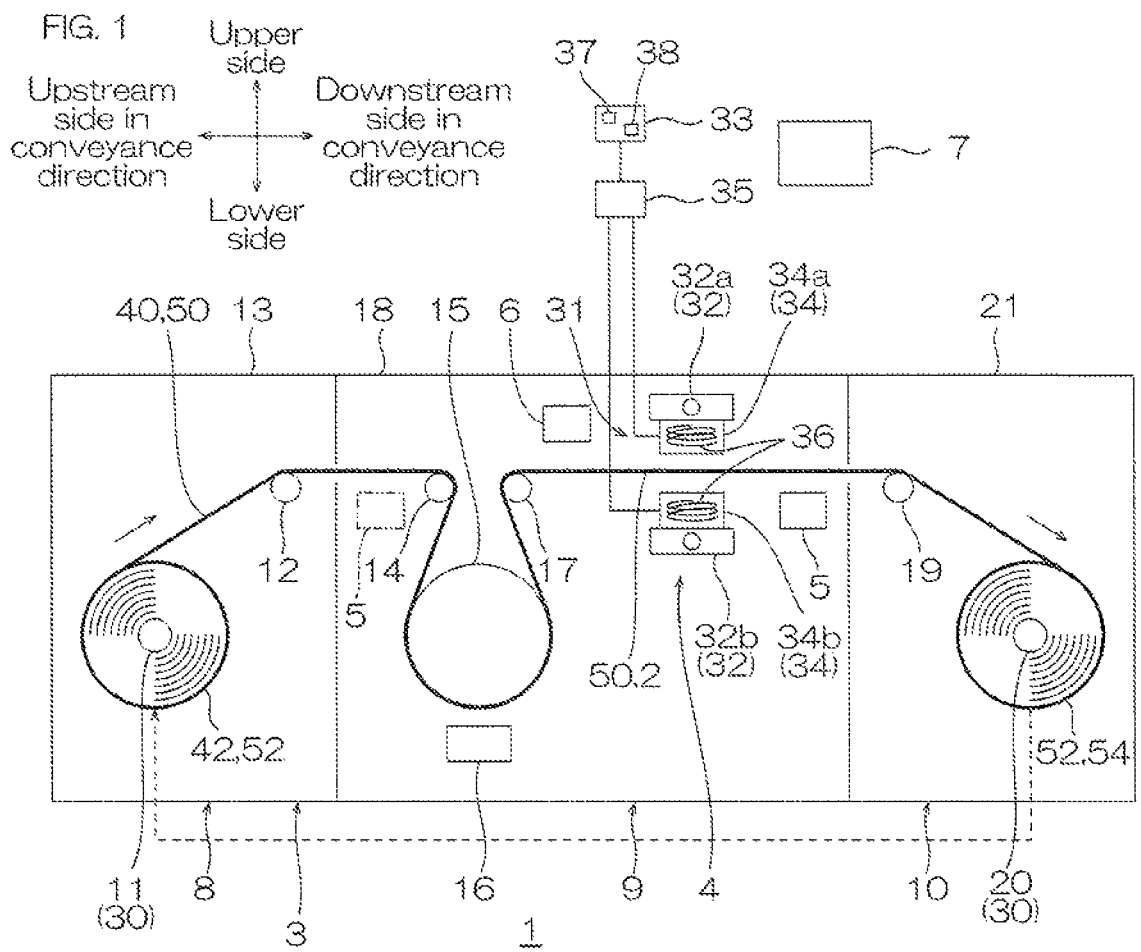

FILM MANUFACTURING APPARATUS AND MANUFACTURING METHOD OF DOUBLE-SIDED LAMINATED FILM

TECHNICAL FIELD

The present invention relates to a film manufacturing apparatus and a method for manufacturing a double-sided laminated film.

BACKGROUND ART

A double-sided electrically conductive film has been conventionally manufactured by laminating an electrically conductive layer on both surfaces of a substrate film in a roll-to-roll method. The double-sided electrically conductive film is required to have a resistance value (sheet resistance) within a desired range, so that a quality defect needs to be discovered by measuring each resistance value of the electrically conductive layers on both surfaces. A method has been known in which the resistance value of the double-sided electrically conductive film is measured by using a non-contact resistance measurement device such as eddy current coil sensor before winding the double-sided electrically conductive film (ref: for example, Patent Document 1).

A measurement method of Patent Document 1 includes the steps of calculating a front-sided resistance value $R_1$ by measuring a voltage $V_1$ of a front-sided conductive layer with an eddy current coil sensor after vapor-depositing a conductive layer on the front surface of a film; calculating a double-sided synthetic resistance value $R_{1+2}$ by measuring a synthetic voltage $V_{1+2}$ of a double-sided conductive layer with another eddy current coil sensor after vapor-depositing the conductive layer on the rear surface of the film; and calculating, by using a specific formula, a rear-sided resistance value $R_2$ from the front-sided resistance value $R_1$ and the double-sided synthetic resistance value $R_{1+2}$.

When a non-contact resistance measurement method is used for the double-sided electrically conductive film, the voltage (consequently, resistance value) of the detected eddy current is measured as a synthetic voltage $V_{1+2}$ of the voltage $V_1$ of the front-sided conductive layer and a voltage $V_2$ of a rear-sided conductive layer, and thus, each voltage (consequently, resistance value) cannot be separately measured. Thus, in the method of Patent Document 1, each front-sided voltage $V_1$ and double-sided synthetic voltage $V_{1+2}$ is measured; next, each front-sided resistance value $R_1$ and double-sided synthetic resistance value $R_{1+2}$ is calculated based on $V_1$ and $V_{1+2}$, respectively; and next, a rear-sided resistance value $R_2$ is calculated based on $R_1$ and $R_{1+2}$.

CITATION LIST

Patent Document

Patent Document 1: Japanese Unexamined Patent Publication No. 2001-3167

SUMMARY OF THE INVENTION

Problem to be Solved by the Invention

To precisely obtain each of the front-sided resistance value $R_1$ and the rear-sided resistance value $R_2$ in the measurement method of Patent Document 1, the measurement positions are each required to be precisely specified, and to be matched as viewed in a thickness direction.

In a device used for the measurement method of Patent Document 1, a first eddy current coil sensor is disposed to face a front-sided electrically conductive film at a downstream side, in a conveyance direction, of a laminating step of a conductive layer on the front side, and a second eddy current coil sensor is disposed to face a double-sided electrically conductive film at the downstream side, in the conveyance direction, of a laminating of a conductive layer on the rear side.

In the device, however, each of the first eddy current coil sensor and the second eddy current coil sensor is merely disposed to face the films. That is, when the double-sided electrically conductive film undergoes a measuring step with the second eddy current coil sensor, a measured position (for example, position in the conveyance direction) to which the measurement with the first eddy current coil sensor is performed cannot be specified, so that a measurement value measured with the first eddy current coil sensor and a measurement value measured with the second eddy current coil sensor cannot be aligned. Accordingly, it is difficult to precisely obtain each resistance value $R_1$ and $R_2$ of the conductive layers on both sides, and thus, there is a disadvantage that it cannot be recognized that each resistance value of the conductive layers on both sides is within a desired range.

The present invention provides a film manufacturing apparatus and a method for manufacturing a double-sided laminated film that are suitable for setting physical properties on both sides of a double-sided laminated film within a desired range.

Means for Solving the Problem

The present invention [1] includes a film manufacturing apparatus for manufacturing a long-length double-sided laminated film including a lamination unit that laminates a first layer at one side in a thickness direction of a long-length substrate film to produce a one-sided laminated film, and that laminates a second layer at the other side in the thickness direction of the one-sided laminated film to produce a double-sided laminated film; a conveyance unit that conveys the one-sided laminated film and the double-sided laminated film in a conveyance direction; a marking unit that imparts a mark to the one-sided laminated film; a measurement unit that measures physical properties of the one-sided laminated film and the double-sided laminated film; a detection unit, disposed at an upstream side in the conveyance direction of the measurement unit, that detects the mark; and an arithmetic unit that obtains physical properties of the first layer and the second layer, based on the physical property at a first position in the one-sided laminated film and the physical property at a second position in the double-sided laminated film, wherein the arithmetic unit defines, with the mark as a reference, a position substantially the same as the first position, as viewed in the thickness direction, to be the second position.

The film manufacturing apparatus includes the marking unit, the detection unit, and the arithmetic unit; and the arithmetic unit defines, with the mark as a reference, a position that is substantially the same as the first position to be the second position.

Thus, the first position measured in the one-sided laminated film can match the second position measured in the double-sided laminated film. Therefore, the physical property at a specific position in the first layer, and the physical property at substantially the same position in the second layer can be precisely calculated, so that a defect of each physical property value of the first layer and the second layer, when it exists, can be accurately detected. As a result, the double-sided laminated film in which each of both layers has a desired physical property can be surely manufactured.

The present invention [2] includes the film manufacturing apparatus described in [1], wherein the first layer is a first electrically conductive layer, the second layer is a second electrically conductive layer, and the physical properties are sheet resistances.

In the film manufacturing apparatus, the double-sided laminated film in which each electrically conductive layer on both sides has a desired sheet resistance can be manufactured.

The present invention [3] includes the film manufacturing apparatus described in [1] or [2], wherein the measurement unit includes a probe unit disposed to face the one-sided laminated film and the double-sided laminated film; and a scanning unit that allows the probe unit to scan in a cross direction crossing the conveyance direction.

The film manufacturing apparatus includes the scanning unit that allows the probe unit to scan in the cross direction. Thus, the film manufacturing apparatus can also measure, in the double-sided laminated film, a freely-selected portion in the cross direction in addition to a freely-selected portion in the conveyance direction. Accordingly, the double-sided laminated film having the desired physical property also in the cross direction of the film can be surely manufactured.

The present invention [4] includes a method for manufacturing a double-sided laminated film, the film being long-length, including a first lamination step of laminating a first layer at one side in a thickness direction of a long-length substrate film to produce a one-sided laminated film; a first measurement step of measuring a physical property of the one-sided laminated film while conveying the one-sided laminated film in a conveyance direction; a marking step of imparting a mark to the one-sided laminated film; a second lamination step of laminating a second layer at the other side in the thickness direction of the one-sided laminated film to produce a double-sided laminated film; a detection step of detecting the mark; a second measurement step of measuring a physical property of the double-sided laminated film while conveying the double-sided laminated film in the conveyance direction; and an arithmetic step of defining, with the mark as a reference, a position substantially the same as a first position in the one-sided laminated film, as viewed in the thickness direction, to be a second position in the double-sided laminated film, and obtaining physical properties of the first layer and the second layer, based on the physical property at the first position in the one-sided laminated film and the physical property at the second position in the double-sided laminated film.

The method for manufacturing a double-sided laminated film includes the marking step of imparting the mark to the one-sided laminated film, and the arithmetic step of defining, with the mark as a reference, a position that is substantially the same as the first position in the one-sided laminated film, as viewed in the thickness direction, to be a second position in the double-sided laminated film.

Thus, the first position measured in the one-sided laminated film can match the second position measured in the double-sided laminated film. Therefore, the physical property of the first layer at a specific position, and the physical property of the second layer at substantially the same position can be precisely calculated, so that a defect of each physical property value of the first layer and the second layer can be accurately detected. As a result, the double-sided laminated film in which each of both layers has a desired physical property can be surely manufactured.

The present invention [5] includes the method for manufacturing a double-sided laminated film described in [4], wherein the first layer is a first electrically conductive layer, the second layer is a second electrically conductive layer, and the physical properties are sheet resistances.

In the manufacturing method, the double-sided laminated film in which each electrically conductive layer on both sides has a desired sheet resistance can be manufactured.

The present invention [6] includes the method for manufacturing a double-sided laminated film described in [4] or [5], wherein the first measurement step is a step of measuring the physical property of the one-sided laminated film while allowing a probe unit to scan in a cross direction crossing the conveyance direction of the one-sided laminated film; the second measurement step is a step of measuring the physical property of the double-sided laminated film while allowing the probe unit to scan in the cross direction of the double-sided laminated film, and in the second measurement step, the probe unit is made to scan a position in the double-sided laminated film based on the mark, so that the position is substantially the same as a position scanned by the probe unit in the first measurement step in the one-sided laminated film.

In the manufacturing method, the physical property of the one-sided laminated film and the physical property of the double-sided laminated film are measured, while making the probe unit scan in the cross direction. Also, the probe unit is made to scan a position in the double-sided laminated film based on the mark, so that the position is substantially the same as a position scanned in the first measurement in the one-sided laminated film.

Thus, the film manufacturing apparatus can also measure, in the double-sided laminated film, a freely-selected portion in the cross direction in addition to al freely-selected portion in the conveyance direction. Accordingly, the double-sided laminated film having the desired physical property also in the cross direction of the film can be surely manufactured.

Effect of the Invention

According to the film manufacturing apparatus and the method for manufacturing a double-sided laminated film of the present invention, a double-sided laminated film in which each of the first layer and the second layer laminated on both sides of a substrate film has a desired physical property can be manufactured.

BRIEF DESCRIPTION OF THE DRAWINGS

FIG. 1 shows one embodiment of a film manufacturing apparatus of the present invention.

FIG. 2A illustrating a front view and

FIG. 2B illustrating a plan view.

DESCRIPTION OF EMBODIMENTS

Figure 2A:
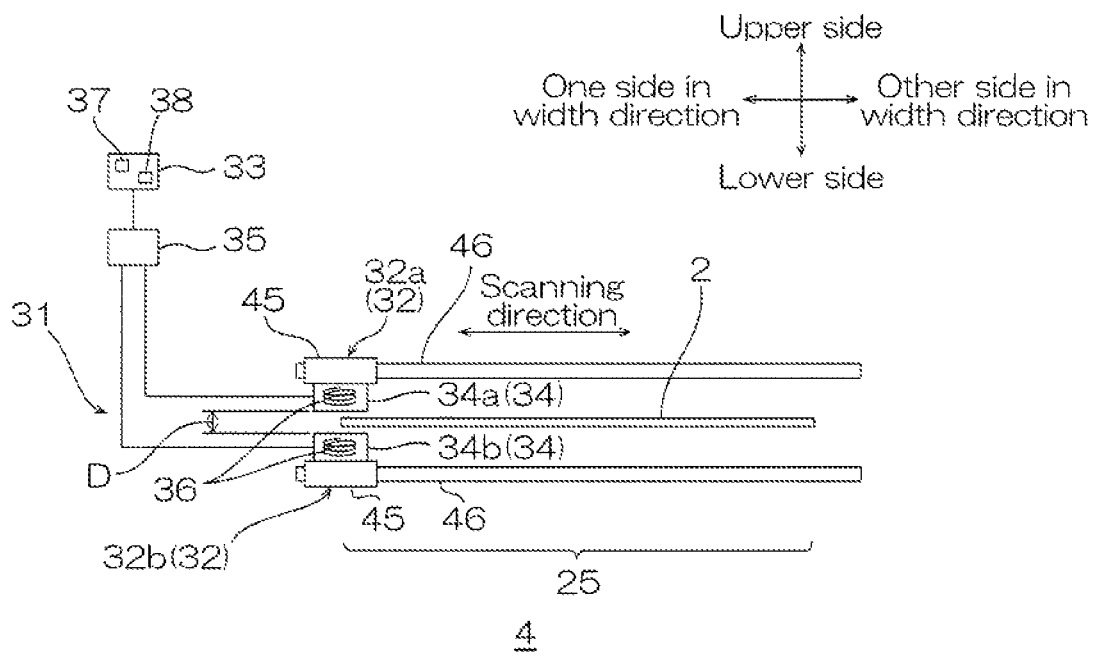
FIGS. 2A and 2B show a resistance measurement device provided in the film manufacturing apparatus shown in FIG. 1.

In FIG. 1, the right-left direction on the plane of the sheet is a conveyance direction (first direction, longitudinal direction, one direction), the right side on the plane of the sheet is a downstream side in the conveyance direction (one side in the first direction, one side in the longitudinal direction), and the left side on the plane of the sheet is an upstream side in the conveyance direction (the other side in the first direction, the other side in the longitudinal direction). The paper thickness direction is a width direction (second direction perpendicular to the first direction), the near side on the plane of the sheet is one side in the width direction (one side in the second direction), and the depth side on the plane of the sheet is the other side in the width direction (the other side in the second direction). The up-down direction on the plane of the sheet is an up-down direction (third direction perpendicular to the first direction and the second direction, thickness direction), the upper side on the plane of the sheet is an upper side (one side in the third direction, one side in the thickness direction), and the lower side on the plane of the sheet is a lower side (the other side in the third direction, the other side in the thickness direction). Directions in views other than FIG. 1 are also in conformity with those of FIG. 1.

<One Embodiment>

1. Film Manufacturing Apparatus

A film manufacturing apparatus 1 of one embodiment of the present invention is described with reference to FIGS. 1 to 3. The film manufacturing apparatus 1 shown in FIG. 1 is an apparatus for manufacturing a double-sided laminated film 2 that is long in length in the conveyance direction (one direction), and includes a lamination conveyance device 3, a resistance measurement device 4, a marking unit 5, a detection unit 6, and a control unit 7.

[Lamination Conveyance Device]

As shown in FIG. 1, the lamination conveyance device 3 includes a feeding unit 8, a sputtering unit 9 as one example of a lamination unit, and a winding unit 10.

The feeding unit 8 includes a feeding roll 11, a first guiding roll 12, and a feeding chamber 13.

The feeding roll 11 is a columnar member, having a rotation axis, for feeding a substrate film 40 or a one-sided laminated film 50 to be described later. The feeding roll 11 is disposed at the most upstream-side in the conveyance direction of the lamination conveyance device 3. A motor (not shown) for rotating the feeding roll 11 is connected to the feeding roll 11.

The first guiding roll 12 is a rotation member that guides the substrate film 40 or the one-sided laminated film 50 fed out from the feeding roll 11 to the sputtering unit 9. The first guiding roll 12 is disposed at the downstream side in the conveyance direction of the feeding roll 11 and the upstream side in the conveyance direction of a second guiding roll 14 (described later).

The feeding chamber 13 is casing for housing the feeding roll 11 and the first guiding roll 12. The feeding chamber 13 is provided with a vacuum unit for enabling vacuumization of the inside of the feeding chamber 13.

In the sputtering unit 9, a first electrically conductive layer 41 (described later) is laminated on the substrate film 40, and a second electrically conductive layer 51 (described later) is laminated on the one-sided laminated film 50 by a sputtering method. The sputtering unit 9 is disposed at the downstream side in the conveyance direction of the feeding unit 8 and the upstream side in the conveyance direction of the winding unit 10 so as to be adjacent to the feeding unit 8 and the winding unit 10. The sputtering unit 9 includes a second guiding roll 14, a film-forming roll 15, a target 16, a third guiding roll 17, and a film-forming chamber 18.

The second guiding roll 14 is a rotation member that guides the substrate film 40 or the one-sided laminated film 50 conveyed from the feeding unit 8 to the film-forming roll 15. The second guiding roll 14 is disposed at the downstream side in the conveyance direction of the first guiding roll 12 and the upstream side in the conveyance direction of the film-forming roll 15.

The film-forming roll 15 is a columnar member, having a rotation axis, for laminating the first electrically conductive layer 41 on the substrate film 40, or laminating the second electrically conductive layer 51 on the one-sided laminated film 50. The film-forming roll 15 conveys the substrate film 40 or the one-sided laminated film 50 along a circumferential surface of the film-forming roll 15 in a circumferential direction thereof. The film-forming roll 15 is disposed at the downstream side in the conveyance direction of the second guiding roll 14 and the upstream side in the conveyance direction of the third guiding roll 17.

The target 16 is formed from a material for the first electrically conductive layer 41 or the second electrically conductive layer 51. The target 16 is disposed around the film-forming roll 15. To be specific, the target 16 is disposed to face the film-forming roll 15 at the lower side thereof in spaced apart relation to the film-forming roll 15.

The third guiding roll 17 is a rotation member that guides the one-sided laminated film 50 or the double-sided laminated film 2 conveyed from the film-forming roll 15 to the winding unit 10 via the resistance measurement device 4. The third guiding roll 17 is disposed at the downstream side in the conveyance direction of the second guiding roll 14 and the upstream side in the conveyance direction of a fourth guiding roll 19 (described later).

The film-forming chamber 18 is a casing for housing the second guiding roll 14, the film-forming roll 15, the target 16, the third guiding roll 17, and a resistance measurement device 4 (described later). The film-forming chamber 18 is provided with a vacuum unit for enabling vacuumization of the inside of the film-forming chamber 18.

The winding unit 10 includes a fourth guiding roll 19, a winding roll 20, and a winding chamber 21. The winding unit 10 is disposed at the downstream side in the conveyance direction of the sputtering unit 9 so as to be adjacent thereto.

The fourth guiding roll 19 is a rotation member that guides the one-sided laminated film 50 or the double-sided laminated film 2 conveyed from the sputtering unit 9 to the winding roll 20. The fourth guiding roll 19 is disposed at the downstream side in the conveyance direction of the third guiding roll 17 and the upstream side in the conveyance direction of the winding roll 20.

The winding roll 20 is a columnar member, having a rotation axis, for winding the one-sided laminated film 50 or the double-sided laminated film 2. The winding roll 20 is disposed at the most downstream-side in the conveyance direction of the substrate film 40. A motor (not shown) for rotating the winding roll 20 is connected to the winding roll 20.

The winding chamber 21 is a casing for housing the winding roll 20 and the fourth guiding roll 19. The winding chamber 21 is provided with a vacuum unit for enabling vacuumization of the inside of the winding chamber 21.

The feeding roll 11 and the winding roll 20 constitute one example of a conveyance unit 30.

[Resistance Measurement Device]

As shown in FIG. 1, the resistance measurement device 4 is disposed at the inside of the sputtering unit 9. To be specific, the resistance measurement device 4 is disposed at the downstream side in the conveyance direction of the film-forming roll 15 and the third guiding roll 17 and the upstream side in the conveyance direction of the fourth guiding roll 19 and the winding roll 20.

Figure 2B:
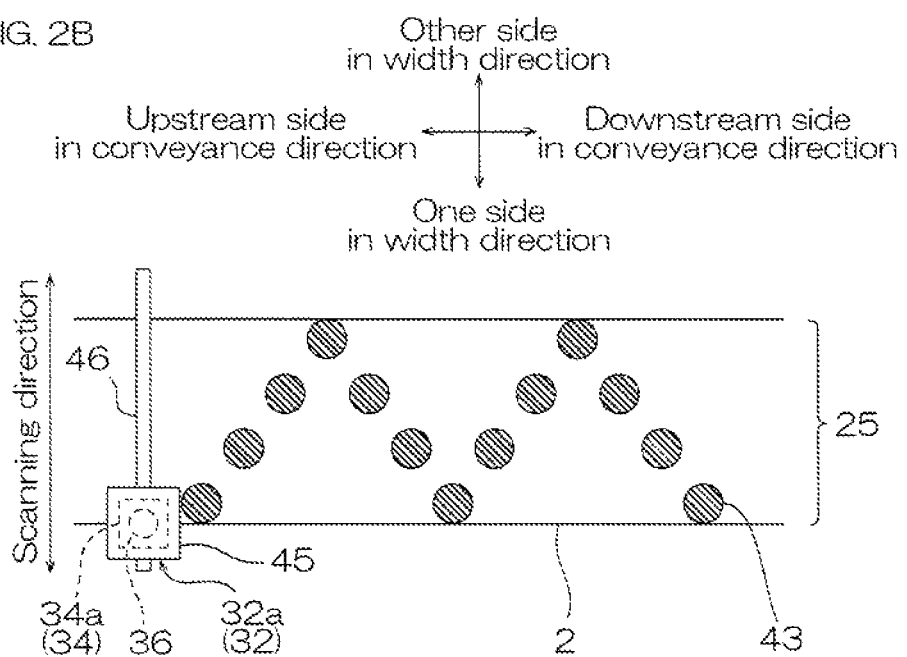
Figure 3:
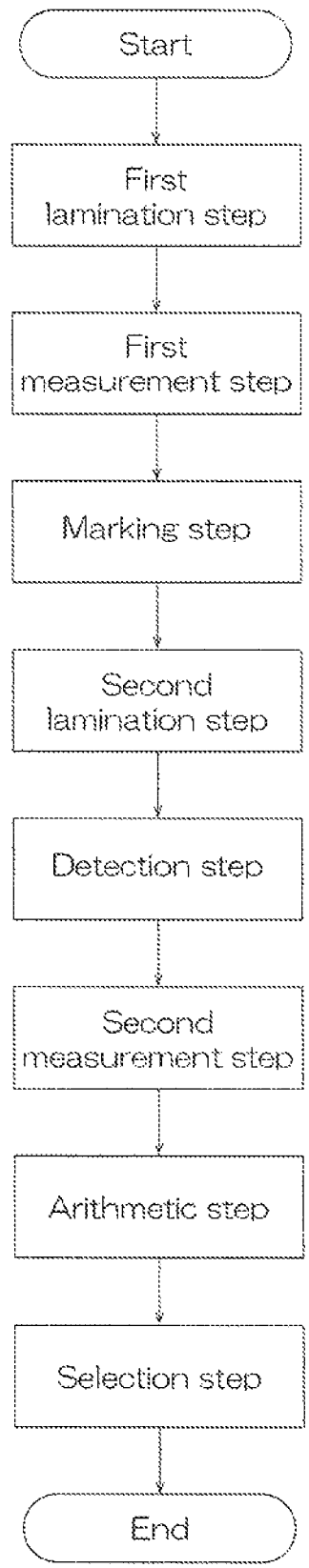
FIG. 3 shows a flow chart of one embodiment of a method for manufacturing a double-sided laminated film of the present invention.

As shown in FIGS. 2A to 2B, the resistance measurement device 4 includes a non-contact resistance measurement unit 31 (hereinafter, also abbreviated as a measurement unit 31), a scanning unit 32, and an arithmetic unit 33.

The measurement unit 31 is a unit that measures sheet resistance of an object to be measured in a state of not being in contact with the object to be measured (the one-sided laminated film 50 or the double-sided laminated film 2). To be specific, the measurement unit 31 is an eddy current-type measurement unit. In the measurement unit 31, an eddy current is generated in the object to be measured by applying a magnetic field thereto, and the sheet resistance of the electrically conductive film 2 is measured by using a change in an electric current flowing in a coil 36 due to the influence of the eddy current.

The measurement unit 31 includes a probe unit 34 and a measurement circuit unit 35.

The probe unit 34 is a unit that receives information (magnetic field or the like) from the object to be measured. To be specific, the probe unit 34 applies the magnetic field to the object to be measured, and converts a diamagnetic field due to the eddy current of the object to be measured into the electric current.

The probe unit 34 is a double-sided probing unit, and includes two probes 34a and 34b that are disposed in spaced apart relation to face each other. That is, the probe unit 34 includes the upper-side probe 34a disposed at the upper side of the object to be measured in spaced apart relation to the object, and the lower-side probe 34b disposed at the lower side of the object to be measured in spaced apart relation to the object. A distance in the up-down direction between the two probes 34a and 34b is variable. That is, at least one of an upper-side scanning unit 32a and a lower-side scanning unit 32b to be described later is movable and fixable in the up-down direction.

Each of the upper-side probe 34a and the lower-side probe 34b includes the coil 36. The coil 36 disposed in the upper-side probe 34a and the coil 36 disposed in the lower-side probe 34b are provided so as to have substantially the same shape when projected in the up-down direction.

Each of the coils 36 has a diameter of, for example, 100 mm or less, preferably 80 mm or less, and more preferably 40 mm or less; and for example, 10 mm or more. When the diameter of the coil 36 is the above-described upper limit or less, the minimum area of measurement positions 43 and 53 at which the probe unit 34 can detect the sheet resistance can be reduced, and sensitivity (resolution) in the width direction thereof can be improved.

A distance D in the up-down direction (probe gap) between the probe units 34 is, for example, 5 mm or more, and preferably 10 mm or more; and for example, 30 mm or less, and preferably 15 mm or less.

The measurement circuit unit 35 is a unit including an electric circuit that is electrically connected to the two coils 36. The measurement circuit unit 35 includes, for example, an element required for driving the measurement unit 31 such as high-frequency oscillator, condenser, voltmeter, ammeter, and I-V conversion circuit.

The scanning unit 32 is a unit for moving the probe unit 34 in the width direction (direction perpendicular to the conveyance direction: one example of a cross direction). The scanning unit 32 reciprocates the probe unit 34 between one end portion in the width direction and the other end portion in the width direction of a conveyance region 25 (described later), while relative arrangement (facing arrangement) of the upper-side probe 34a and the lower-side probe 34b is retained.

The scanning unit 32 includes the upper-side scanning unit 32a and the lower-side scanning unit 32b.

The upper-side scanning unit 32a includes a slider 45 that retains the upper-side probe 34a on the lower surface (the other-side surface in the thickness direction) thereof, and a linear guiding axis (traverse axis) 46 crossing both end edges of the conveyance region 25 in the width direction. In the upper-side scanning unit 32a, the slider 45 outer-fits the guiding axis 46 slidably, and the slider 45 linearly moves so as to traverse the conveyance region 25 in the width direction along the guiding axis 46 by a driving force of a motor that is not shown.

The lower-side scanning unit 32b includes the slider 45 that retains the lower-side probe 34b on the upper surface (one-side surface in the thickness direction) thereof and the linear guiding axis (traverse axis) 46 crossing both end edges of the conveyance region 25 in the width direction. These are the same as the slider 45 and the guiding axis 46 of the upper-side scanning unit 32a.

The arithmetic unit 33 includes a memory 37 and a CPU 38.

The memory 37 memorizes data of a measurement position, sheet resistance, and a mark position. To be specific, the memory 37 memorizes first measurement data showing a relationship between the first measurement position 43 and one-sided sheet resistance $R_1$, second measurement data showing a relationship between the second measurement position 53 and double-sided synthetic sheet resistance $R_{1+2}$, and mark data showing a relationship between a mark 23 and the first measurement position 43.

The memory 37 also memorizes a collation program and a calculation program.

The collation program specifies, in the double-sided laminated film 2, substantially the same position as the first measurement position 43 as the second measurement position 53 with the mark 23 as a reference. To be specific, the collation program specifies, with the position of the mark 23 as a reference, a plurality of second measurement positions 53 in the double-sided laminated film 2 that are each substantially the same as one of a plurality of first measurement positions 43 in the one-sided laminated film 50.

The calculation program calculates a sheet resistance of the first electrically conductive layer 41 (first layer sheet resistance) and a sheet resistance of the second electrically conductive layer 51 (second layer sheet resistance) based on the sheet resistance of the one-sided laminated film 50 (the one-sided sheet resistance $R_1$) and the sheet resistance of the double-sided laminated film 2 (the double-sided synthetic sheet resistance $R_{1+2}$).

The CPU 38 carries out the above-described collation program and calculation program, and obtains the first layer sheet resistance and the second layer sheet resistance based on the one-sided sheet resistance $R_1$ at the first measurement position 43 and the double-sided synthetic sheet resistance $R_{1+2}$ at the second measurement position 53 specified in the collation program.

[Marking Unit]

The marking unit 5 is a unit that imparts the mark 23 to the one-sided laminated film 50 (described later).

The marking unit 5 is disposed at the inside of the sputtering unit 9. The marking unit 5 is disposed at the downstream side in the conveyance direction of the measurement unit 31 and the upstream side in the conveyance direction of the fourth guiding roll 19 and the winding roll 20.

Examples of the marking unit 5 include embossing machines, punching machines, laser markers, and ink jet printers.

[Detection Unit]

The detection unit 6 is a unit that detects the mark 23 imparted in the marking unit 5.

The detection unit 6 is disposed at the inside of the sputtering unit 9. The detection unit 6 is disposed at the downstream side in the conveyance direction of the film-forming roll 15 and the third guiding roll 17 and the upstream side in the conveyance direction of the measurement unit 31.

Examples of the detection unit 6 include optical sensors for detecting a shape, such as surface unevenness and a through hole, of the one-sided laminated film 50, and optical sensors for detecting an optical pattern, such as ink pattern.

[Control Unit]

The control unit 7 is electrically connected to each of the amination conveyance device 3, the resistance measurement device 4, the marking unit 5, and the detection unit 6 (not shown). The control unit 7 controls and activates them by interlocking them or independently.

To be specific, the control unit 7 activates the marking unit 5, and imparts the mark 23 to a predetermined position of the one-sided laminated film 50 conveyed by the lamination conveyance device 3. Also, the control unit 7 activates the arithmetic unit 33 of the resistance measurement device 4 based on the information (mark position) sent from the detection unit 6 to measure the sheet resistance of the predetermined position (the second measurement position 53) in the double-sided laminated film 2 conveyed by the lamination conveyance device 3.

2. Method for Manufacturing Film

One embodiment of a method for manufacturing the double-sided laminated film 2 by using the film manufacturing apparatus 1 is described. As shown in FIG. 3, the method for manufacturing the double-sided laminated film 2 includes a first lamination step, a first measurement step, a marking step, a second lamination step, a detection step, a second measurement step, an arithmetic step, and a selection step.

[First Lamination Step]

As shown in FIG. 1, in the first lamination step, the first electrically conductive layer 41 as one example of a first layer is laminated on the substrate film 40, while the substrate film 40 is conveyed. To be specific, the first electrically conductive layer 41 is formed on the one-side surface (surface at one side in the thickness direction) of the substrate film 40 by the sputtering method, while the substrate film 40 is conveyed.

First, the substrate film 40 that is long in length in the conveyance direction is disposed in the feeding roll 11. That is, a first rolled body 42 obtained by winding the long-length substrate film 40 in a rolled shape is mounted on the feeding roll 11.

An example of the substrate film 40 includes a polymer film. Examples of a material for the polymer film include polyester resins such as polyethylene terephthalate, poly-butylene terephthalate, and polyethylene naphthalate; (meth)acrylic resins such as polymethacrylate; olefin resins such as polyethylene, polypropylene, and cycloolefin polymer; polycarbonate resin; polyether sulfone resin; polyarylate resin; melamine resin; polyamide resin; polyimide resin; cellulose resin; and polystyrene resin.

A length in the width direction of the substrate film 40 (that is, length in the width direction of the conveyance region 25) is, for example, 100 mm or more, and preferably 200 mm or more; and for example, 5000 mm or less, and preferably 2000 mm or less.

Next, the feeding roll 11 and the winding roll 20 are each rotationally driven by a motor to feed the substrate film 40 out from the feeding roll 11. Then, the substrate film 40 is sequentially conveyed to the first guiding roll 12, the second guiding roll 14, the film-forming roll 15, the third guiding roll 17, and the fourth guiding roll 19 to be wound around the winding roll 20.

A conveyance rate of the substrate film 40 (conveyance rate of the one-sided laminated film 50) is, for example, 10 mm/sec or more, and preferably 100 mm/sec or more; and for example, 500 mm/sec or less, and preferably 300 mm/sec or less.

In this manner, the substrate film 40 is conveyed from the feeding roll 11 to the winding roll 20 in the conveyance direction in a roll-to-roll method (first conveyance step).

Next, sputtering is carried out. That is, the sputtering unit 9 is activated, and the first electrically conductive layer 41 is formed on the one-side surface of the substrate film 40.

To be specific, gas (argon or the like) is supplied to the inside of the film-forming chamber 18 under vacuum, and a voltage is applied thereto, so that the gas collides with the target 16. As a result, a target material sprung out from the target 16 is, below the film-forming roll 15, attached to the lower surface of the substrate film 40 that is conveyed from the upstream side in the conveyance direction, thereby forming the first electrically conductive layer 41.

Examples of a material for the target 16, that is, a material for the first electrically conductive layer 41 include metal oxides such as indium tin composite oxide, and antimony tin composite oxide; metal nitrides such as aluminum nitride, titanium nitride, tantalum nitride, chromium nitride, gallium nitride, and composite nitride thereof; and metals such as gold, silver, copper, nickel, and alloy thereof.

In this manner the one-sided laminated film 50 including the substrate film 40, and the first electrically conductive layer 41 laminated on the one-side surface thereof is produced at the lower side of the film-forming roll 15 (first layer forming step).

Thereafter, the one-sided laminated film 50 produced at the lower side of the film-forming roll 15 is conveyed toward the resistance measurement device 4 at the downstream side in the conveyance direction by the film-forming roll 15 and the third guiding roll 17.

[First Measurement Step]

As shown in FIGS. 2A to 2B, in the first measurement step, the sheet resistance of the one-sided laminated film 50 (the one-sided sheet resistance $R_1$) is measured, while the one-sided laminated film 50 is conveyed in the conveyance direction.

To be specific, the measurement unit 31 is activated. That is, the magnetic field is applied from the probe unit 34 to the conveyed one-sided laminated film 50, a change in the electric current of the measurement circuit unit 35 generated by the eddy current produced in the one-sided laminated film 50 is detected, and the sheet resistance is calculated from the voltage thereof.

In the first measurement step, the sheet resistance is measured, while the probe unit 34 scans in the width direction. To be specific, the measurement is carried out in a plurality of times, while the probe unit 34 is reciprocated between one end portion in the width direction and the other end portion in the width direction of the conveyance region 25. In this manner, the measurement is carried out in the plurality of first measurement positions 43 (plurality of first positions) in the one-sided laminated film 50.

The conveyance region 25 is a region that is overlapped with the conveyed one-sided laminated film 50 or the conveyed double-sided laminated film 2 when projected in the up-down direction (thickness direction), and a length in the width direction of the conveyance region 25 matches the length in the width direction of the films 50 and 2.

In the one-sided laminated film 50, each region of the plurality of first measurement positions 43 has a generally circular shape that is larger than the coil 36 when viewed from the top. That is, the diameter of each region of the first measurement positions 43 is larger than the diameter of the coil 36. A pattern consisting of an assembly of the plurality of first measurement positions 43 (first measurement pattern) has a wave shape proceeding in the conveyance direction.

A scanning rate of the probe unit 34 is, for example, 10 mm/sec or more, and preferably 100 mm/se or more; and for example, 500 mm/sec or less, and preferably 300 mm/sec or less.

In this manner, the data of the one-sided sheet resistance $R_1$ is measured to be memorized in the memory 37. To be specific, the first measurement data showing a relationship between the measurement position (the plurality of first measurement positions 43) and the one-sided sheet resistance $R_1$ at each of the first measurement position is obtained.

In the measurement unit 31, the data of a graph showing a relationship between measurement time (horizontal axis) and the one-sided sheet resistance $R_1$ at the time (vertical axis) is obtained. By considering the measurement time, and the conveyance rate of the one-sided laminated film 50 and the scanning rate of the scanning unit 32, the measurement position is calculated. As a result, the first measurement data showing a relationship between the measurement position and the one-sided sheet resistance $R_1$ at the position can be obtained. This is also the same as the second measurement data in the second measurement step.

[Marking Step]

In the marking step, the mark 23 is imparted to the one-sided laminated film 50. To be specific, the mark 23 is imparted to the first electrically conductive layer 41 of the one-sided laminated film 50.

The mark 23 is imparted to a predetermined position (for example, starting position, end position or the like of the first measurement pattern) that clarifies a position relationship between the mark 23 and the first measurement position 43 in advance based on the mark data memorized in the memory 37 by the activation of the marking unit 5.

Examples of the mark 23 include recessed portions, through holes, and ink.

Examples of a pattern of the mark 23 include polygonal shapes (triangle, quadrangle, or the like), circular shapes (dotted shape, dewdrop shape, or the like), bar codes, and symbols (characters, numerical characters, or the like).

Examples of an imparting method of the mark 23 include dent, scratch, punching, laser marking, and printing (ink jet, application).

The number of imparting times of the mark 23 (that is, the number of mark 23 imparted to the one-sided laminated film 50) may be once or a plurality of times.

To be specific, as the mark position, any one of the lowermost end portion in the conveyance direction of the one-sided laminated film 50 (that is, the innermost-side portion in the first rolled body 42), the uppermost end portion in the conveyance direction of the one-sided laminated film 50 (that is, the outermost-side portion in the first rolled body 42), and an intermediate portion in the conveyance direction of the one-sided laminated film 50 may be used.

Thereafter, the one-sided laminated film 50 to which the mark 23 is imparted is wound around the winding roll 20 in the winding chamber 21. In this manner, a second rolled body 52 obtained by winding the long-length one-sided laminated film 50 in a rolled shape is obtained.

[Second Lamination Step]

In the second lamination step, the second electrically conductive layer 51 as one example of a second layer is laminated on the one-sided laminated film 50, while the one-sided laminated film 50 is conveyed. To be specific, the second electrically conductive layer 51 is formed on the other-side surface (surface at the other side in the thickness direction) of the one-sided laminated film 50 by the sputtering method, while the one-sided laminated film 50 is conveyed.

First, the second rolled body 52 is disposed in the feeding roll 11. To be specific, the second rolled body 52 is removed from the winding roll 20 to be mounted on the feeding roll 11.

At this time, the second rolled body 52 is mounted so that the second electrically conductive layer 51 is laminated on the other-side surface of the one-sided laminated film 50. That is, the second rolled body 52 is rewound around another roll, and the one-side surface and the other-side surface of the one-sided laminated film 50 are reversed.

Next, the feeding roll 11 and the winding roll 20 are each rotationally driven by the motor to feed the one-sided laminated film 50 out from the feeding roll 11. Then, the one-sided laminated film 50 is conveyed to the first guiding roll 12, the second guiding roll 14, the film-forming roll 15, the third guiding roll 17, and the fourth guiding roll 19 in this order to be wound around the winding roll 20.

The conveyance rate of the one-sided laminated film 50 (conveyance rate of the double-sided laminated film 2) is the same as that of the first lamination step.

In this manner, the one-sided laminated film 50 is conveyed from the feeding roll 11 to the winding roll 20 in the conveyance direction in the roll-to-roll method (second conveyance step).

Next, the sputtering is carried out. That is, the sputtering unit 9 is activated, and the second electrically conductive layer 51 is formed on the other-side surface of the one-sided laminated film 50.

A method and a material for the sputtering are the same as those of the first layer lamination step.

In this manner, the double-sided laminated film 2 (double-sided electrically conductive film) including the substrate film 40, the first electrically conductive layer 41 laminated on the one-side surface thereof, and the second electrically conductive layer 51 laminated on the other-side surface thereof is produced at the lower side of the film-forming roll 15 (second layer forming step).

Thereafter, the double-sided laminated film 2 produced at the lower side of the film-forming roll 15 is conveyed toward the downstream side in the conveyance direction by the film-forming roll 15 and the third guiding roll 17.

[Detection Step]

In the detection step, the mark 23 imparted to the double-sided laminated film 2 is detected.

The detection unit 6 sends a detection signal to the control unit 7 when the mark 23 is detected.

[Second Measurement Step]

The second measurement step measures the sheet resistance of the double-sided laminated film 2 (the double-sided synthetic sheet resistance $R_{1+2}$), while the double-sided laminated film 2 is conveyed in the conveyance direction.

To be specific, the measurement unit 31 is activated in the same manner as that of the first measurement step. In this manner, the sheet resistance of the conveyed double-sided laminated film 2 is calculated.

In the second measurement step, the sheet resistance is measured, while the probe unit 34 scans in the width direction in the same manner as that of the first measurement step. To be specific, the measurement is carried out in the plurality of times, while the probe unit 34 is reciprocated between one end portion in the width direction and the other end portion in the width direction of the conveyance region 25. In this manner, the measurement is carried out in the plurality of second measurement positions 53 (plurality of second positions) in the double-sided laminated film 2.

At this time, the probe unit 34 is made to scan the double-sided laminated film 2 based on the mark 23 so as to scan substantially the same positions as the positions scanned by the probe unit 34 in the first measurement step in the one-sided laminated film 50.

That is, when the detection unit 6 detects the mark 23, the detection unit 6 sends a detection signal to the control unit 7. The control unit 7 controls the arithmetic unit 33, and activates the scanning unit 32 to make the probe unit 34 scan the double-sided laminated film 2 so that the probe unit 34 scans the positions that match the plurality of first measurement positions 43 based on the data of the plurality of first measurement positions 43 and the mark positions memorized in the memory 37. Also, the measurement unit 31 is activated to carry out the measurement so that the plurality of second measurement positions 53 match the plurality of first measurement positions 43.

A pattern consisting of an assembly of the plurality of second measurement positions 53 (second measurement pattern) is generally the same as the first measurement pattern. The positions measured in the first measurement step and the positions measured in the second measurement step are generally the same in the thickness direction (that is, when viewed from the top).

A case where a scanning position of the one-sided laminated film 50 and a scanning position of the double-sided laminated film 2 are substantially the same means that a distance between the two scanning positions is, for example, 200 mm or less, preferably 100 mm or less, more preferably 10 mm or less, and further more preferably 1 mm or less.

The scanning rate of the probe unit 34 in the second measurement step is the same as that of the first measurement step.

In this manner, the data of the double-sided synthetic sheet resistance $R_{1+2}$ is measured to be memorized in the memory 37. To be specific, the second measurement data showing a relationship between the measurement position (the plurality of second measurement positions 53) and the double-sided synthetic sheet resistance $R_{1+2}$ at each of the second measurement position is obtained. The double-sided synthetic sheet resistance $R_{1+2}$ is a sheet resistance obtained by synthesizing the sheet resistance of the first electrically conductive layer 41 (first layer sheet resistance) with the sheet resistance of the second electrically conductive layer 51 (second layer sheet resistance).

[Arithmetic Step]

In the arithmetic step, with the mark 23 as a reference, the positions in the double-sided laminated film 2 substantially the same as the first positions 43 in the one-sided laminated film 50, as view in the thickness direction, to be the second positions 53 (collation step). Next, the first layer sheet resistance and the second layer sheet resistance are obtained based on the one-sided sheet resistance $R_1$ at the first measurement positions 43 and the double-sided synthetic sheet resistance $R_{1+2}$ at the second measurement position 53 (calculation step).

In the collation step, the mark data showing a position relationship between the mark 23 and the plurality of first measurement positions 43 is obtained from the memory 37 to collate the position relationship between the mark 23 and the plurality of second measurement positions 53. In this manner, each of the plurality of second measurement positions 53 that is substantially the same as each of the plurality of first measurement positions 43 is specified.

Subsequently, the one-sided sheet resistance $R_1$ measured at the first measurement position 43, and the double-sided synthetic sheet resistance $R_{1+2}$ measured at the second measurement position 53 corresponding thereto are specified.

Figure 4:
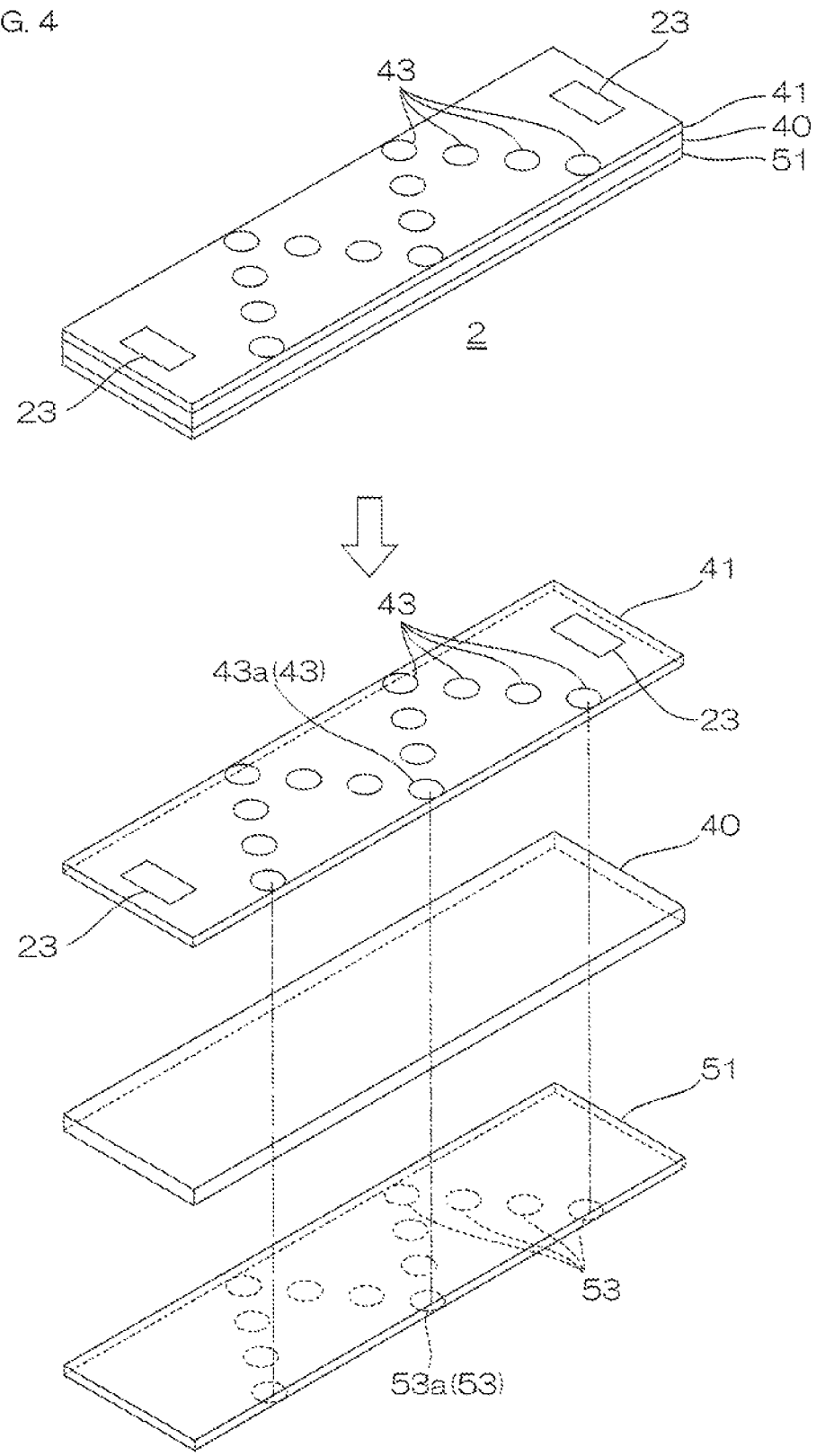
FIG. 4 shows a double-sided laminated film of the present invention, and a disassembled perspective view thereof.

As shown in FIG. 4, as one specific example, one first measurement position 43*a* of the plurality of first measurement positions 43 and one second measurement position 53*a* that is substantially the same position as the one first measurement position 43*a* are specified. Then, the one-sided sheet resistance $R_1$ of the one first measurement position 43*a* and the double-sided synthetic sheet resistance $R_{1+2}$ of the one second measurement position 53*a* are specified.

A case where the first measurement position 43 and the second measurement position 53 are substantially the same means that a distance between the two measurement positions is, for example, 200 mm or less, preferably 100 mm or less, more preferably 10 mm or less, and further more preferably 1 mm or less.

In the calculation step, the first layer sheet resistance is obtained based on the one-sided sheet resistance $R_1$ of the first measurement position 43. That is, the one-sided sheet resistance $R_1$ of the first measurement position 43 is defined as the first layer sheet resistance of the first measurement position 43.

The second layer sheet resistance is obtained based on the one-sided sheet resistance $R_1$ of the first measurement position 43 and the double-sided synthetic sheet resistance $R_{1+2}$ of the second measurement position 53. That is, the second layer sheet resistance of the second measurement position 53 is calculated based on the following formula by using the one-sided sheet resistance $R_1$ of the first measurement position 43 and the double-sided synthetic sheet resistance $R_{1+2}$ of the second measurement position 53.

$$R_2 = \frac{R_1 \cdot R_{1+2}}{R_1 - R_{1+2}}$$

The above-described $R_2$ shows the second layer sheet resistance.

At this time, of the double-sided synthetic sheet resistance $R_{1+2}$ at the plurality of second measurement positions 53, the double-sided synthetic sheet resistance $R_{1+2}$ at the second measurement position 53 specified in the collation step is used with respect to the one-sided sheet resistance $R_1$ at the first measurement position 43.

In this manner, the data of the second layer sheet resistance is obtained. As a result, the first layer sheet resistance and the second layer sheet resistance measured at substantially the same position in the double-sided laminated film 2 can be obtained.

[Selection Step]

In the selection step, the double-sided laminated film 2 is selected based on the obtained first layer sheet resistance and second layer sheet resistance.

To be specific, when a plot showing a value (defective value) of the sheet resistance that is outside of a predetermined range is detected based on each of the first layer sheet resistance and the second layer sheet resistance, the measurement position showing the defective value is specified. Next, desired treatment (removal of the double-sided laminated film 2; processing of the first electrically conductive layer 41 and the second electrically conductive layer 52; feedback control of a film-forming process parameter such as gas and electric power in the first electrically conductive layer 41 and the second electrically conductive layer 52; or the like) is carried out for the double-sided laminated film 2 at the position.

In this manner, the double-sided laminated film 2 having the sheet resistance on both sides within a desired range is manufactured.

Thereafter, the double-sided laminated film 2 is wound around the winding roll 20 in the winding chamber 21. In this manner, a third rolled body 54 obtained by winding the long-length double-sided laminated film 2 in a rolled shape is obtained.

3. Function and Effect

The film manufacturing apparatus 1 includes the sputtering unit 9 that laminates the first electrically conductive layer 41 at one side of the long-length substrate film 40 to produce the one-sided laminated film 50, and laminates the second electrically conductive layer 51 at the other side of the one-sided laminated film 50 to produce the double-sided laminated film 2; the conveyance unit 30 that conveys the one-sided laminated film 50 and the double-sided laminated film 2 in the conveyance direction; the marking unit 5 that imparts the mark 23 to the one-sided laminated film 50; the measurement unit 31 that measures the one-sided sheet resistance $R_1$ and the double-sided synthetic sheet resistance $R_{1+2}$; the detection unit 6, disposed at the upstream side in the conveyance direction of the measurement unit 31, that detects the mark 23; and the arithmetic unit 33 that obtains the first layer sheet resistance and the second layer sheet resistance based on the one-sided sheet resistance $R_1$ at the first measurement position 43 and the double-sided synthetic sheet resistance $R_{1+2}$ at the second measurement position 53. The arithmetic unit 33 defines, with the mark 23 as a reference, a position substantially the same as the first measurement position 43 to be the second measurement position 53.

Thus, the first measurement position 43 measured in the one-sided laminated film 50 can match the second measurement position 53 measured in the double-sided laminated film 2. Therefore, the one-sided sheet resistance $R_1$ at a specific position, and the double-sided synthetic sheet resistance $R_{1+2}$ at substantially the same position can be precisely specified. Accordingly, the first layer sheet resistance at the specific position and the second layer sheet resistance at substantially the same position can be precisely calculated, so that a defect of each of the first layer sheet resistance and the second layer sheet resistance, when is exists, can be accurately detected. As a result, the double-sided laminated film 2 in which each of both layers has a desired sheet resistance can be surely manufactured.

In the film manufacturing apparatus 1, the measurement unit 31 further includes the probe unit 34 disposed to face the one-sided laminated film 50 and the double-sided laminated film 2, and the scanning unit 32 that allows the probe unit 34 to scan in the width direction.

Thus, the film manufacturing apparatus 1 can also measure, in the double-sided laminated film 2, a freely-selected portion in the width direction in addition to a freely-selected portion in the conveyance direction. Accordingly, the double-sided laminated film 2 having the desired sheet resistance also in the width direction of the film can be surely manufactured.

The method for manufacturing a film includes the first lamination step of laminating the first electrically conductive layer 41 at one side of the long-length substrate film 40 to produce the one-sided laminated film 50; the first measurement step of measuring the one-sided sheet resistance $R_1$ while conveying the one-sided laminated film 50 in the conveyance direction; the marking step of imparting the mark 23 to the one-sided laminated film 50; the second lamination step of laminating the second electrically conductive layer 51 at the other side of the one-sided laminated film 50 to produce the double-sided laminated film 2; the detection step of detecting the mark 23; the second measurement step of measuring the double-sided synthetic sheet resistance $R_{1+2}$ while conveying the double-sided laminated film 2 in the conveyance direction; and the arithmetic step of defining, with the mark 23 as a reference, a position in the double-sided laminated film 2 substantially the same as the first measurement position 43 in the one-sided laminated film 50 to be the second measurement position 53, and obtaining the first layer sheet resistance and the second layer sheet resistance based on the one-sided sheet resistance $R_1$ at the first measurement position 43 and the double-sided synthetic sheet resistance $R_{1+2}$ at the second measurement position 53.

Thus, the first measurement position 43 measured in the one-sided laminated film 50 can match the second measurement position 53 measured in the double-sided laminated film 2. Therefore, the one-sided sheet resistance $R_1$ at a specific position, and the double-sided synthetic sheet resistance $R_{1+2}$ at substantially the same position can be precisely specified. Accordingly, the first layer sheet resistance at the specific position and the second layer sheet resistance at substantially the same position can be precisely calculated, so that a defect of each of the first layer sheet resistance and the second layer sheet resistance, when it exists, can be accurately detected. As a result, the double-sided laminated film 2 in which each of both layers has a desired sheet resistance can be surely manufactured.

In the method for manufacturing a film, the first measurement step is a step of measuring the one-sided sheet resistance, while the probe unit 34 scans in the width direction of the one-sided laminated film 50, and the second measurement step is a step of measuring the double-sided synthetic sheet resistance, while the probe unit 34 scans in the width direction of the double-sided laminated film 2. Also, in the second measurement step, the probe unit 34 is made to scan the double-sided laminated film 2 based on the mark 23 so as to scan substantially the same position as the positions scanned by the probe unit 34 in the first measurement step in the one-sided laminated film 50.

Thus, the film manufacturing apparatus 1 can also measure, in the double-sided laminated film 2, a freely-selected portion in the width direction in addition to a freely-selected portion in the conveyance direction. Accordingly, the double-sided laminated film 2 having the desired sheet resistance also in the width direction of the film can be surely manufactured.

4. Modified Examples

In the following modified examples, the same reference numerals are provided for members and steps corresponding to each of those in the above-described one embodiment, and their detailed description is omitted. The modified examples can be appropriately used in combination. Furthermore, each of the modified examples can achieve the same function and effect as that of one embodiment unless otherwise specified.

(First Modified Example)

In one embodiment of manufacturing the double-sided laminated film 2 by using the film manufacturing apparatus 1 shown in FIG. 1, the first electrically conductive layer 41 and the second electrically conductive layer 51 are laminated by using the same sputtering unit 9. Alternatively, for example, as shown in FIG. 5, the first electrically conductive layer 41 and the second electrically conductive layer 51 can be also laminated by using different sputtering units.

Figure 5:
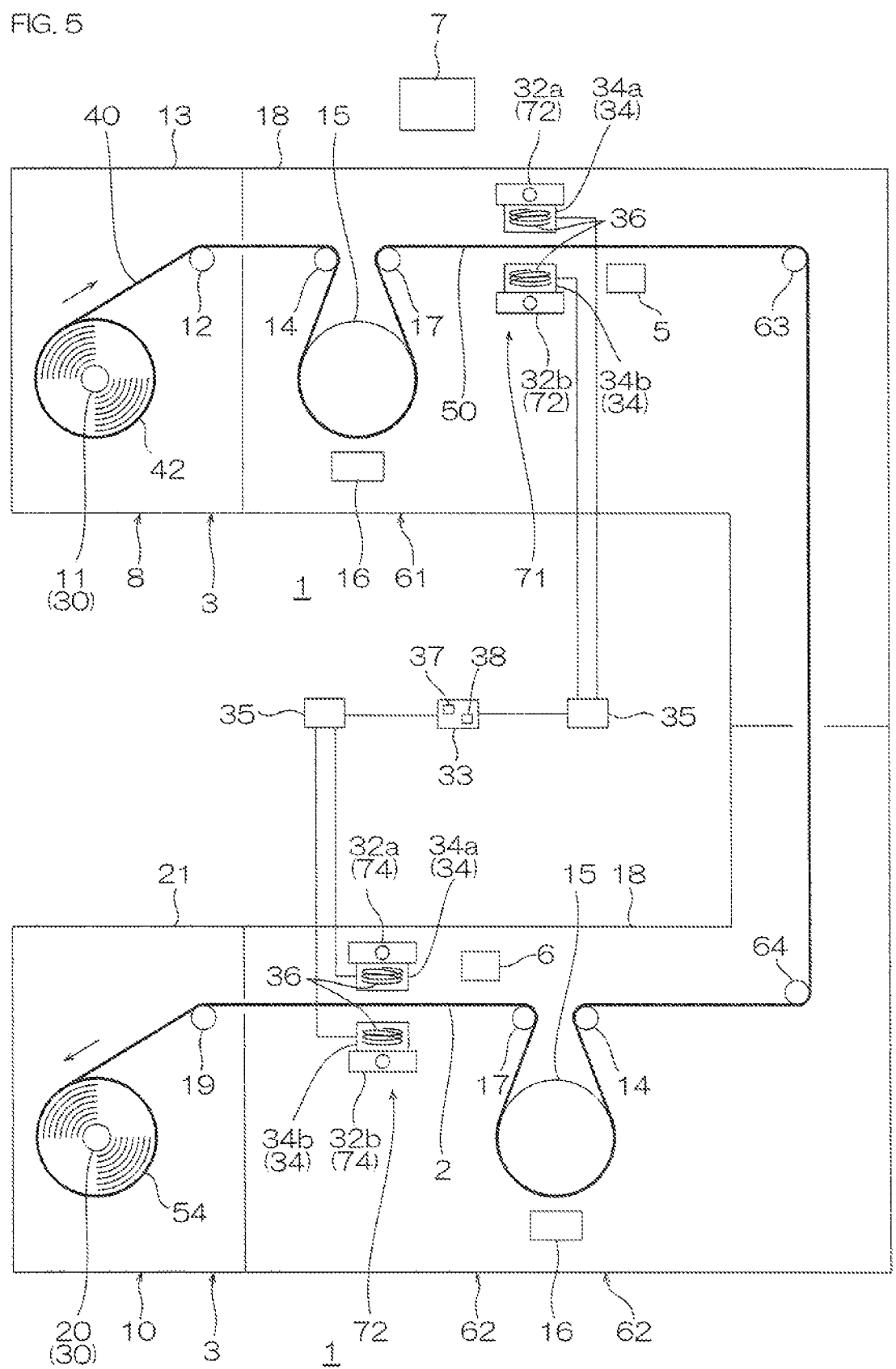
FIG. 5 shows a modified example (embodiment including a first sputtering unit and a second sputtering unit) of the film manufacturing apparatus of the present invention.

The film manufacturing apparatus 1 shown in FIG. 5 includes the lamination conveyance device 3, the resistance measurement device 4, the marking unit 5, and the detection unit 6. The lamination conveyance device 3 includes the feeding unit 8, a first sputtering unit 61, a second sputtering unit 62, and the winding unit 10.

The first sputtering unit 61 is disposed at the downstream side in the conveyance direction of the feeding unit 8 and the upstream side in the conveyance direction of the second sputtering unit 62, and includes the second guiding roll 14, the film-forming roll 15, the target 16, the third guiding roll 17, a fifth guiding roll 63, and the film-forming chamber 18.

The second sputtering unit 62 is disposed at the downstream side in the conveyance direction of the first sputtering unit 61 and the upstream side in the conveyance direction of the winding unit 10, and includes a sixth guiding roll 64, the second guiding roll 14, the film-forming roll 15, the target 16, the third guiding roll 17, and the film-forming chamber 18.

The resistance measurement device 4 includes a first non-contact resistance measurement unit 71 (hereinafter, also abbreviated as a first measurement unit), a first scanning unit 72, a second non-contact resistance measurement unit 73 (hereinafter, also abbreviated as a second measurement unit), a second scanning unit 74, and the arithmetic unit 33.

The first measurement unit 71 and the first scanning unit 72 are disposed at the inside of the first sputtering unit 61.

The first measurement unit 71 is the same as the measurement unit 31 shown in FIG. 1. The first scanning unit 72 is the same as the scanning unit 32 shown in FIG. 1, and moves the probe unit 34 of the first measurement unit 71.

The second measurement unit 73 and the second scanning unit 74 are disposed at the inside of the second sputtering unit 62.

The second measurement unit 73 is the same as the measurement unit 31 shown in FIG. 1. The second scanning unit 74 is the same as the scanning unit 32 shown in FIG. 1, and moves the probe unit 34 of the second measurement unit 73.

The arithmetic unit 33 is connected to both the first measurement unit 71 and the second measurement unit 73.

The marking unit 5 is disposed at the inside of the first sputtering unit 61, and disposed at the downstream side in the conveyance direction of the first measurement unit 71.

The detection unit 6 is disposed at the inside of the second sputtering unit 62, and disposed at the downstream side in the conveyance direction of the film-forming roll 15 and the upstream side in the conveyance direction of the second measurement unit 73.

When the double-sided laminated film 2 is manufactured by using the film manufacturing apparatus 1 shown in FIG. 5, first, the substrate film 40 (the first rolled body 42) is fed out from the feeding unit 8 toward the downstream side in the conveyance direction, and subsequently, the first electrically conductive layer 41 is laminated in the first sputtering unit 61, thereby forming the one-sided laminated film 50. Subsequently, in the one-sided laminated film 50, the one-sided sheet resistance $R_1$ at the first measurement position 43 is measured in the first measurement unit 71, and the mark 23 is imparted in the marking unit 5. Subsequently, the second electrically conductive layer 51 is formed in the second sputtering unit 62, thereby forming the double-sided laminated film 2. Subsequently, in the double-sided laminated film 2, the mark 23 is detected in the detection unit 6, and the double-sided synthetic resistance value $R_{1+2}$ at the second measurement position 53 is measured in the second measurement unit 73. Thereafter, the double-sided laminated film 2 is wound around the winding unit 10, thereby obtaining the third rolled body 54.

(Second Modified Example)

In the embodiment shown in FIG. 1, the marking unit 5 is disposed at the downstream side in the conveyance direction of the measurement unit 31. Alternatively, for example, as shown by a phantom line of FIG. 1, the marking unit 5 may be also disposed at the upstream side in the conveyance direction of the measurement unit 31, for example, the upstream side in the conveyance direction of the film-forming roll 15.

In this case, the marking step is carried out before the first measurement step. Marking is carried out in the substrate film 40, so that the mark 23 is imparted to the substrate film 40 of the one-sided laminated film 50.

(Third Modified Example)

In the embodiment shown in FIG. 1, the sheet resistance is measured as physical properties of the first electrically conductive layer 41 and the second electrically conductive layer 51. Alternatively, for example, physical property such as surface roughness and film thickness can be also measured.

The probe unit 34 and the measurement circuit unit 35 can use a known or commercially available surface roughness measurement device in the measurement of the surface roughness.

The surface roughness of the first electrically conductive layer 41 is obtained as a surface roughness at the first measurement position 43 of the first electrically conductive layer-side in the one-sided laminated film 50. The surface roughness of the second electrically conductive layer 51 is obtained as a surface roughness at the second measurement position 53 of the second electrically conductive layer-side in the double-sided laminated film 2.

(Fourth Modified Example)

In the embodiment shown in FIG. 1, the double-sided laminated film 2 including the first electrically conductive layer 41 as a first layer and the second electrically conductive layer 51 as a second layer is manufactured. Alternatively, for example, as the first layer and the second layer, a layer other than the electrically conductive layer, such as thermally conductive layer and optical adjustment layer, can be also used.

In this case, examples of the physical property to be measured include thermal conductivity, refractive index, surface roughness, and film thickness.

(Fifth Modified Example)

In the embodiment shown in FIG. 1, the sputtering unit is provided as a lamination unit. Alternatively, for example, a vacuum vapor deposition unit and a chemical vapor deposition unit can be also provided as the lamination unit. In this case, the lamination unit includes a vapor deposition source consisting of a material for the electrically conductive layers 41 and 51 instead of the target 16. The lamination unit may be also an application unit, a printing unit, or the like.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The film manufacturing apparatus of the present invention can be applied for various industrial products, and can be, for example, preferably used for manufacturing a double-sided laminated film such as double-sided electrically conductive film.

DESCRIPTION OF REFERENCE NUMBER

1 Film manufacturing apparatus
2 Double-sided laminated film
3 Lamination conveyance device
4 Resistance measurement device
5 Marking unit
6 Detection unit
9 Sputtering unit
23 Mark
30 Conveyance unit
31 Measurement unit
32 Scanning unit
33 Arithmetic unit
34 Probe unit
40 Substrate film
41 First electrically conductive layer
43 First measurement position
50 One-sided laminated film
51 Second electrically conductive layer
53 Second measurement position

The invention claimed is:

1. A film manufacturing apparatus for manufacturing a long-length double-sided laminated film, comprising:
a lamination unit that laminates a first layer at one side in a thickness direction of a long-length substrate film to produce a one-sided laminated film, and that laminates a second layer at the other side in the thickness direction of the one-sided laminated film to produce a double-sided laminated film;
a conveyance unit that conveys the one-sided laminated film and the double-sided laminated film in a conveyance direction;
a marking unit that imparts a mark to the one-sided laminated film;
a measurement unit that measures physical properties of the one-sided laminated film and the double-sided laminated film;
a detection unit, disposed at an upstream side in the conveyance direction of the measurement unit, that detects the mark; and
an arithmetic unit that obtains physical properties of the first layer and the second layer, based on the physical property at a first position in the one-sided laminated film and the physical property at a second position in the double-sided laminated film,
wherein the arithmetic unit defines, with the mark as a reference, a position substantially the same as the first position, as viewed in the thickness direction, to be the second position.

2. The film manufacturing apparatus according to claim 1, wherein
the first layer is a first electrically conductive layer,
the second layer is a second electrically conductive layer, and
the physical properties are sheet resistances.

3. The film manufacturing apparatus according to claim 1, wherein
the measurement unit includes:
a probe unit disposed to face the one-sided laminated film and the double-sided laminated film; and
a scanning unit that allows the probe unit to scan in a cross direction crossing the conveyance direction.

4. A method for manufacturing a double-sided laminated film, the film being long-length, comprising:
a first lamination step of laminating a first layer at one side in a thickness direction of a long-length substrate film to produce a one-sided laminated film;
a first measurement step of measuring a physical property of the one-sided laminated film while conveying the one-sided laminated film in a conveyance direction;
a marking step of imparting a mark to the one-sided laminated film;
a second lamination step of laminating a second layer at the other side in the thickness direction of the one-sided laminated film to produce a double-sided laminated film;
a detection step of detecting the mark;
a second measurement step of measuring a physical property of the double-sided laminated film while conveying the double-sided laminated film in the conveyance direction; and
an arithmetic step of defining, with the mark as a reference, a position in the double-sided laminated film substantially the same as a first position in the one-sided laminated film, as view in the thickness direction, to be a second position; and obtaining physical properties of the first layer and the second layer, based on the physical property at the first position in the one-sided laminated film and the physical property at the second position in the double-sided laminated film.

5. The method for manufacturing a double-sided laminated film according to claim 4, wherein
the first layer is a first electrically conductive layer,
the second layer is a second electrically conductive layer, and
the physical properties are sheet resistances.

6. The method for manufacturing a double-sided laminated film according to claim 4, wherein
the first measurement step is a step of measuring the physical property of the one-sided laminated film while allowing a probe unit to scan the one-sided laminated film in a cross direction crossing the conveyance direction;

the second measurement step is a step of measuring the physical property of the double-sided laminated film while allowing the probe unit to scan the double-sided laminated film in the cross direction; and in the second measurement step, the probe unit is made to scan a position in the double-sided laminated film based on the mark, so that the position is substantially the same as a position scanned by the probe unit in the first measurement step in the one-sided laminated film.

* * * * *